United States Patent

Yang et al.

[11] Patent Number: 5,868,843
[45] Date of Patent: Feb. 9, 1999

[54] DETACHABLE SPONGE DEVICE FOR SPIN-COATING MACHINES

[75] Inventors: Yu-Chen Yang, KaoHsiung; Chang-Chi Huang, Miao Li; Wen-Ping Yen, Hsinchu, all of Taiwan

[73] Assignee: Winbond Electronics Corporation, Taiwan

[21] Appl. No.: 783,103

[22] Filed: Jan. 14, 1997

[30] Foreign Application Priority Data

Oct. 21, 1996 [TW] Taiwan ................................ 85216207

[51] Int. Cl.⁶ ..................................................... B05C 21/00
[52] U.S. Cl. ............................ 118/504; 118/505; 118/52; 118/56; 118/319; 118/320
[58] Field of Search ..................................... 118/504, 505, 118/52, 56, 319, 320; 134/902, 153, 154; 204/298.11; 156/345

[56] References Cited

U.S. PATENT DOCUMENTS

| | | | |
|---|---|---|---|
| 5,480,530 | 1/1996 | Zejda | 118/504 |
| 5,482,612 | 1/1996 | Armstrong et al. | 204/298.11 |
| 5,614,071 | 3/1997 | Mahvan et al. | 204/298.11 |
| 5,637,199 | 6/1997 | Lorentz et al. | 204/298.11 |

*Primary Examiner*—Laura Edwards
*Attorney, Agent, or Firm*—Rabin & Champagne, P.C.

[57] ABSTRACT

A detachable sponge device for a spin coating machine used to coat a liquid material over a semiconductor wafer is provided. The detachable sponge device is used to prevent the solvent that is jetted on the edge of the wafer from being oversprayed elsewhere on the wafer. The detachable sponge device is composed of a curved mounting piece and a corrugated piece of sponge attached on the curved inner side of the mounting piece. The mounting piece can be detachably mounted on the spin coating machine. The corrugated piece of sponge can absorb splattered particles of solvent from the wafer which can thus be prevented from bouncing back onto the wafer. The planarization of the coating of SOG on the wafer thus will not be affected by splattering particles of the solvent. Excellent results of planarization of SOG or photoresist layers can thus be achieved.

6 Claims, 2 Drawing Sheets

DETACHABLE SPONGE DEVICE FOR SPIN-COATING MACHINES

BACKGROUND OF THE INVENTION

1. Field of the Invention

This invention relates in general to spin coating machines that are used to coat a layer of liquefied material, such as spin-on-glass (SOG) or photoresist, with high degree of planarization on a semiconductor wafer. More particularly, this invention relates to a detachable sponge device for a spin coating machine, which is capable of preventing the solvent that is jetted on the edge of the wafer for edge bead rinse (EBR) purpose from being oversprayed elsewhere on the wafer.

2. Description of Related Art

As integrated circuits are fabricated to contain more and more components therein for increased scale of integration, a single wafer is usually divided into multiple layers so that it can contain a vast amount of components therein. This kind of wafer needs to use highly planarized dielectric layers to separate between the multiple layers thereof. One method to form the highly planarized dielectric layers is to use the so-called spin-on-glass (SOG) process to coat a liquefied dielectric material, such as silicon dioxide, on the wafer. The SOG process is usually conducted by a so-called spin coating machine which spins the wafer while the liquefied silicon dioxide is being applied onto the wafer. As a result, due to the centrifugal force from the spinning, the liquefied silicon dioxide can be spread evenly over the wafer so that the planarization of the coating of silicon dioxide is highly effective.

FIG. 1 shows a schematic sectional diagram of a conventional spin coating machine, which has a bowl-shaped area inside 10 including a vacuum chuck 11 therein for securely holding a semiconductor wafer 12 thereon. The vacuum chuck 11 is driven by a servo motor 13 so as to spin the wafer 12 during the SOG process. The thickness and degree of planarization of the SOG coating can be controlled by adjusting the speed of the servo motor 13. During the SOG process, however, the edge of the wafer 12 will also be covered by the SOG, thus forming a spread of fine SOG particles. Conventionally, these fine SOG particles can be removed by a so-called edge bead rinse (EBR) device. As shown in FIG. 1, the EBR device includes a nozzle 14 for jetting a stream of solvent on a margin of about 1 to 2 mm in width on the edge of the wafer 12, by which the fine SOG particles thereon can be washed away.

One major drawback of the foregoing EBR process, however, is that if the solvent is jetted on the edge of the wafer 12 during a high jetting speed or in a great amount, the solvent could be oversprayed elsewhere on the wafer 12, which would substantially affect the planarization of the coating of the SOG layer. In addition, due to the centrifugal force from the spinning of the wafer 12, the solvent jetted on the edge of the wafer 12 will be partly thrown tangentially away from the wafer 12 bumping into and bouncing back from the inner wall 15 of the bowl-shaped area inside 10 onto the wafer 12. This also would affect the planarization of the coating of the SOG layer. Without effective planarization, the final product of the IC chip could lack a quality yield. There exists, therefore, a need for an improved EBR device which is capable of preventing the solvent that is jetted on the edge of the wafer from being sprayed elsewhere on the wafer.

SUMMARY OF THE INVENTION

It is therefore a primary objective of the present invention to provide an improvement to the EBR device for a spin coating machine which is capable of preventing the solvent that is jetted on the edge of the wafer from being oversprayed elsewhere on the wafer.

In accordance with the foregoing and other objectives of the present invention, a detachable sponge device is provided in conjunction with the EBR device. The detachable sponge device is composed of a curved mounting piece and a corrugated piece of sponge attached on the curved inner side of the mounting piece. The mounting piece is formed with a slot on the bottom which can be snugly fitted onto the wall enclosing the bowl-shaped area inside of the spin coating machine. The mounting piece can also be easily detached from the mount. The corrugated piece of sponge is attached on the curved inner side of the mounting piece facing the wafer so that it can be used to absorb and act as a buffer for the oversprayed particles of solvent from the wafer.

With the foregoing detachable sponge device, the splattered particles of solvent from the wafer can be prevented from bouncing back to the wafer. Good planarization of the coating of SOG on the wafer thus can be achieved.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

Figure 1:
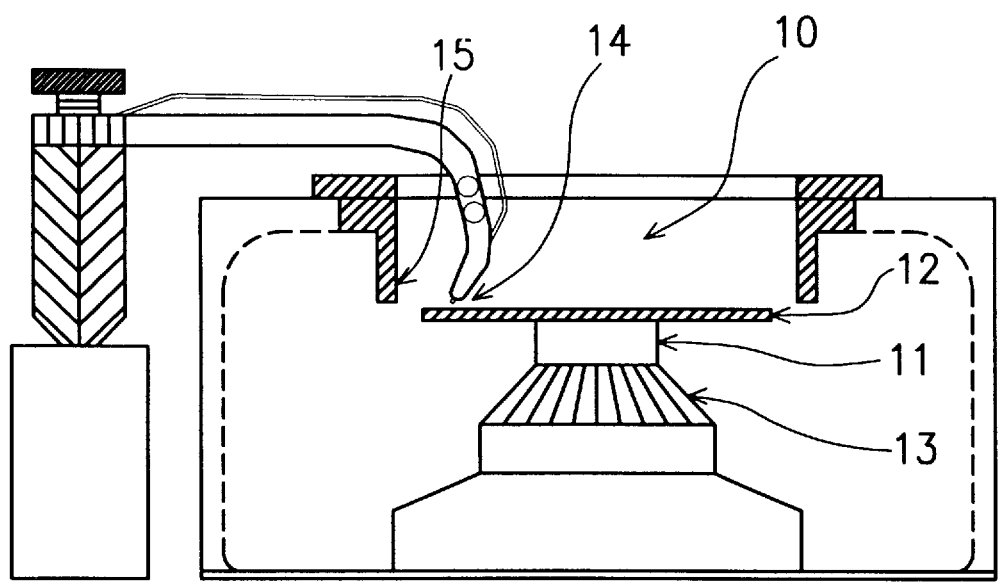
FIG. 1 is a schematic sectional diagram of a conventional spin coating machine.
Figure 2:
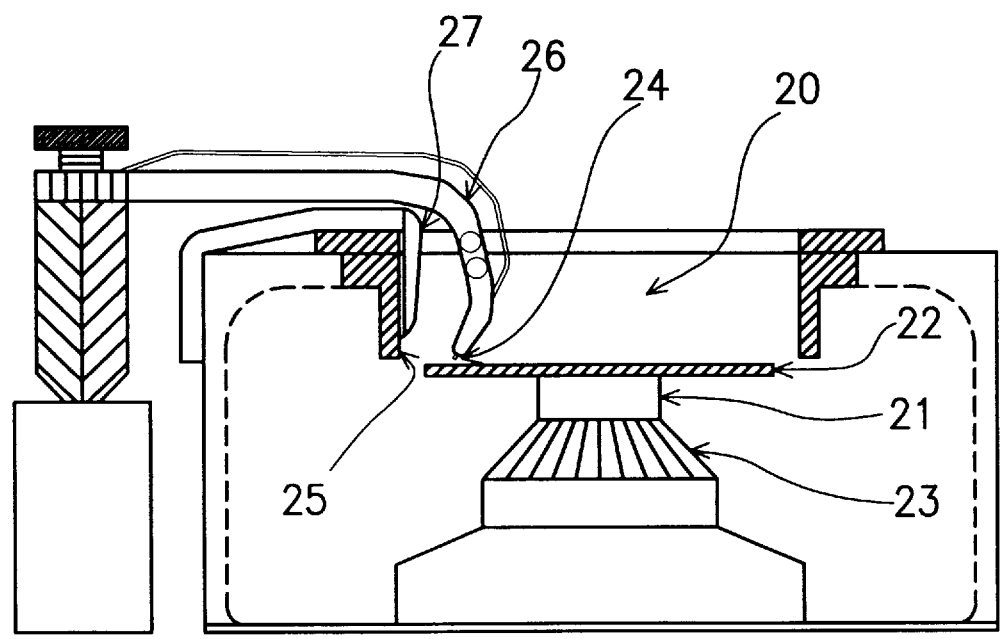
FIG. 2 is a schematic sectional diagram of a spin coating machine which is mounted with the detachable sponge device according to the present invention.

Referring to FIG. 2, there is shown a schematic sectional diagram of a spin coating machine which is mounted with the detachable sponge device of the invention (designated here by the reference numeral 27). This spin coating machine has a bowl-shaped area inside 20 including a vacuum chuck 21 for securely holding a semiconductor wafer 22 thereon. The vacuum chuck 21 is driven by a servo motor 23 so as to spin the wafer 12 during the SOG process. An EBR device 26 having a nozzle 24 is used to jet a stream of solvent on the edge of the wafer 12 during the SOG process so as to wash away the fine SOG particles on the same.

Figure 3:
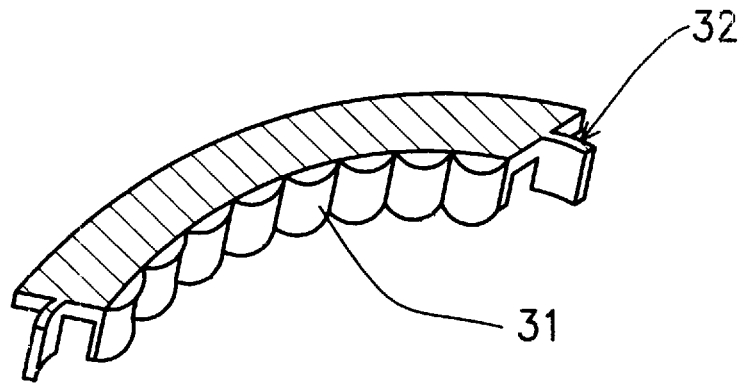
FIG. 3 is a perspective drawing of the detachable sponge device according to the present invention.

To prevent the aforementioned drawbacks of the prior art, the detachable sponge device 27 of the invention is mounted on the inner wall 25 of the bowl-shaped inside area 20 of the spin coating machine, as illustrated in FIG. 2. A perspective view of the detachable sponge device 27 alone is illustrated in FIG. 3. As shown, the detachable sponge device 27 is composed of a curved mounting piece 32 and a corrugated piece of absorbent material 31, such as sponge, attached on the curved inner side of the mounting piece 32. The corrugated piece of sponge 31 is substantially equal in length to the mounting piece 32 so as to cover the whole inner side of the same. The mounting piece 32 is formed with a slot on the bottom which is shaped in such a manner as to be snugly and detachably fittable onto the top of the wall enclosing the bowl-shaped inside area 20 of the spin coating machine. The sponge can absorb and act as a buffer to any oversprayed particles of the solvent from the wafer 22. Moreover, the corrugated surface of the sponge acts as a trapping means to prevent the particles from being directly bounced back therefrom. Therefore, when the oversprayed particles of the solvent bump the corrugated piece of sponge 31, very few will bounce back to the wafer 22. The planarization of the coating of SOG on the wafer 22 will thus not be affected by any splattering particles of the solvent as in the prior art.

Figure 4:
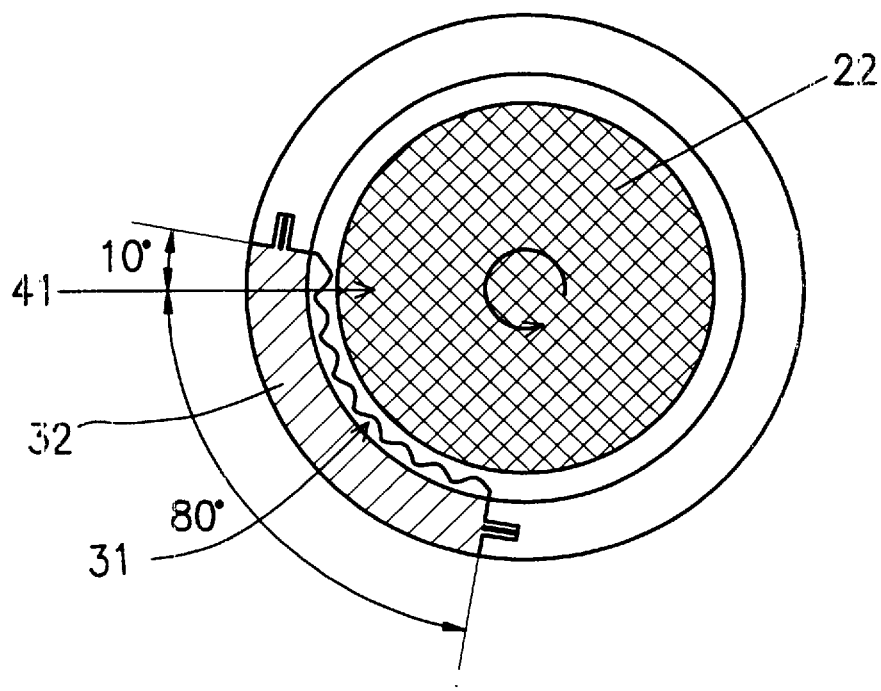
FIG. 4 is a top drawing of the detachable sponge device of FIG. 3 being mounted on the spin coating machine.

Referring further to FIG. 4, assume the reference numeral 41 designates a spot on the wafer 22 where the nozzle 24 of the EBR device is located. In the preferred embodiment, the detachable sponge device 27 is designed in such a manner as to cover all the possible sputtering angles of the solvent from the spot 41. For example, if the wafer 22 spins in a counterclockwise direction, as shown from the top view of FIG. 4, a larger angle should be covered in the counterclockwise direction from the spot 41. In this embodiment, the detachable sponge device 27 covers a 10° angle clockwise from the spot 41 and a 80° angle counterclockwise from the same. This covers one-fourth of the circumference of the wafer 22. When any solvent is sputtered away from the spot 41 onto the wafer 22, the particles of the solvent will be absorbed by the corrugated piece of sponge 31 attached on the curved inner wall of the mounting piece 32. Moreover, due the corrugated surface of the sponge, any particles of the solvent bumping thereinto would be trapped therewithin, whereby very few particles will bounce back to the wafer 22.

In conclusion, the detachable sponge device according to the present invention has the following benefits. First, splattered particles of the solvent from the wafer can be prevented from being bounced back to the same by the sponge absorbing these particles. Second, the foregoing effect can be further increased by the corrugated surface of the sponge that can trap bouncing particles therewithin. Third, the detachable sponge device can be easily dismounted from the spin coating machine for cleaning and maintenance whenever desired.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A detachable sponge device for a spin coating machine used to coat a liquid material over a semiconductor wafer, the spin coating machine having a bowl-shaped inside area enclosed by a wall, said detachable sponge device comprising:
(a) a mounting piece having a slot for fitting into the wall enclosing the bowl-shaped inside area of the spin coating machine; and
(b) a corrugated piece of sponge attached on said mounting piece for preventing oversprayed particles of solvent bumping thereinto from bouncing back onto the wafer.

2. The detachable sponge device of claim 1, wherein said mounting piece is a curved piece.

3. The detachable sponge device of claim 2, wherein said mounting piece covers about one-fourth of the circumference of the wafer.

4. The detachable sponge device of claim 1, wherein said corrugated piece of sponge has a corrugated surface.

5. The detachable sponge device of claim 4, wherein said corrugated surface of said corrugated piece of sponge is arranged to face toward the bowl-shaped inside area to prevent splattered particles bumping thereinto from being bounced back to the wafer.

6. The detachable sponge device of claim 1, wherein said corrugated piece of sponge is substantially equal in length to the mounting piece.

\* \* \* \* \*